(12) United States Patent
Kanda

(10) Patent No.: US 9,265,159 B2
(45) Date of Patent: Feb. 16, 2016

(54) STACKED STRUCTURE AND MANUFACTURING METHOD OF THE SAME

(71) Applicant: FUJITSU LIMITED, Kawasaki-shi, Kanagawa (JP)

(72) Inventor: Takashi Kanda, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 19 days.

(21) Appl. No.: 14/221,330

(22) Filed: Mar. 21, 2014

(65) Prior Publication Data

US 2014/0318840 A1 Oct. 30, 2014

(51) Int. Cl.
*H05K 3/46* (2006.01)
*H05K 3/40* (2006.01)

(52) U.S. Cl.
CPC ............ *H05K 3/4614* (2013.01); *H05K 3/4069* (2013.01); *H05K 2201/0979* (2013.01); *Y10T 156/1056* (2015.01)

(58) Field of Classification Search
CPC ..................... H05K 3/4614; H05K 2201/0979; H05K 3/4069; H05K 3/323; H05K 3/429; H05K 1/112; H05K 1/144; H05K 2201/086; H05K 7/023; Y10T 156/1056
USPC ................... 174/259, 262–266; 361/735, 736
See application file for complete search history.

(56) References Cited

U.S. PATENT DOCUMENTS

| | | | |
|---|---|---|---|
| 5,652,042 A | | 7/1997 | Kawakita et al. |
| 5,733,467 A | | 3/1998 | Kawakita et al. |
| 5,914,358 A | | 6/1999 | Kawakita et al. |
| 5,977,490 A | | 11/1999 | Kawakita et al. |
| 2010/0307808 A1* | 12/2010 | Horiuchi et al. | ............... 174/264 |
| 2011/0024172 A1* | 2/2011 | Maruyama et al. | ........... 174/258 |
| 2011/0095419 A1* | 4/2011 | Horiuchi et al. | .............. 257/737 |
| 2011/0100690 A1 | 5/2011 | Yoshimura et al. | |
| 2013/0192879 A1* | 8/2013 | Morita et al. | ................. 174/251 |
| 2013/0200531 A1* | 8/2013 | Myung et al. | ................. 257/778 |
| 2013/0215586 A1* | 8/2013 | Furusawa et al. | ............. 361/767 |

FOREIGN PATENT DOCUMENTS

| | | |
|---|---|---|
| JP | 2603053 | 4/1997 |
| JP | 2006-049412 | 2/2006 |
| JP | 2008-294246 | 12/2008 |
| JP | 2011-096900 | 5/2011 |

* cited by examiner

*Primary Examiner* — Hoa C Nguyen

(74) *Attorney, Agent, or Firm* — Fujitsu Patent Center

(57) ABSTRACT

An embodiment of a stacked structure includes: a first substrate that includes a first electrode; a second substrate that includes a second electrode; and an adhesive resin material that is provided between the first substrate and the second substrate and includes a plurality of conductive vias, the plurality of conductive vias electrically connecting the first electrode and the second electrode.

4 Claims, 4 Drawing Sheets

STACKED STRUCTURE AND MANUFACTURING METHOD OF THE SAME

CROSS-REFERENCE TO RELATED APPLICATION

This application is based upon and claims the benefit of priority of the prior Japanese Patent Application No. 2013-094176, filed on Apr. 26, 2013, the entire contents of which are incorporated herein by reference.

FIELD

The embodiments discussed herein are directed to a stacked structure and a manufacturing method of the same.

BACKGROUND

A stacked structure is known in which two printed wiring boards are bonded to each other with a prepreg sandwiched between them. Electrodes are provided on the printed wiring boards, and conductive vias corresponding to the electrodes are provided to the prepreg. That is, the prepreg includes conductive vias.

Recently, short circuit easily occurs between conductive vias accompanying micro-fabrication. The short circuit between conductive vias leads to short circuit between electrodes, and since the short circuit between electrodes cannot be repaired, a stacked structure in which such short circuit occurred is discarded. Therefore, occurrence of short circuit leads to decrease in yield.

Patent Literature 1: Japanese Laid-open Patent Publication No. 2006-49412
Patent Literature 2: Japanese Laid-open Patent Publication No. 2008-294246
Patent Literature 3: Japanese Laid-open Patent Publication No. 2011-96900
Patent Literature 4: Japanese Patent No. 2603053

SUMMARY

According to an aspect of the embodiments, a stacked structure includes: a first substrate that includes a first electrode; a second substrate that includes a second electrode; and an adhesive resin material that is provided between the first substrate and the second substrate and includes a plurality of conductive vias, the plurality of conductive vias electrically connecting the first electrode and the second electrode.

According to another aspect of the embodiments, a stacked structure includes: an adhesive resin material; and a first electrode and a second electrode which face each other across the adhesive resin material. The adhesive resin material includes a plurality of conductive vias that electrically connects the first electrode and the second electrode.

According to further another aspect of the embodiments, a method of manufacturing a stacked structure includes: forming a plurality of via holes in an adhesive resin material; attaching a first substrate including a first electrode to the adhesive resin material so that the first electrode is exposed through the plurality of via holes; supplying a conductive paste into each of the plurality of via holes so as to form a plurality of conductive vias; and adhering the first substrate and a second substrate to the adhesive resin material by thermocompression bonding while a second electrode on the second substrate is kept in contact with the plurality of conductive vias.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
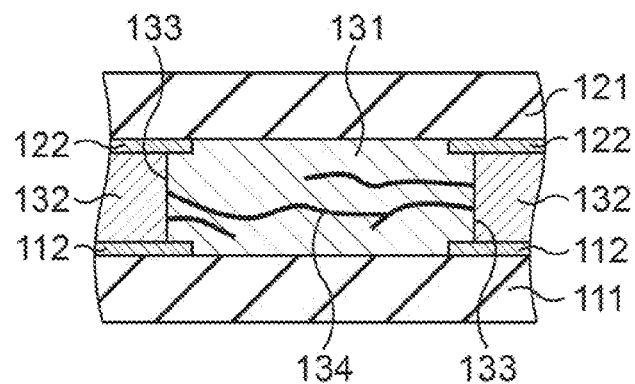
FIG. 1 is a cross-sectional view illustrating a reference example.

The present inventor studied causes for short circuit in a conventional stacked structure, and found that, as in a reference example illustrated in FIG. 1, cracks 134 exist in a prepreg 131, and a conductive paste as a material of conductive vias 132 flows out to the cracks 134. Further, it was found that the cracks 134 occur during formation of via holes 133. The prepreg 131 is a composite material containing a resin and fibers, and hence it is conceivable that the cracks 134 easily occur in the vicinity of an interface between them.

In this reference example, the prepreg 131 is provided between a substrate 111 which includes electrodes 112 and a substrate 121 which includes electrodes 122. Via holes 133 are formed in the prepreg 131, and a conductive via 132 which electrically connects one of the electrodes 112 and one of the electrodes 122 is formed in the via hole 133.

As a result of intensive studies based on such knowledge, the present inventor conceived embodiments described below.

Figure 2A:
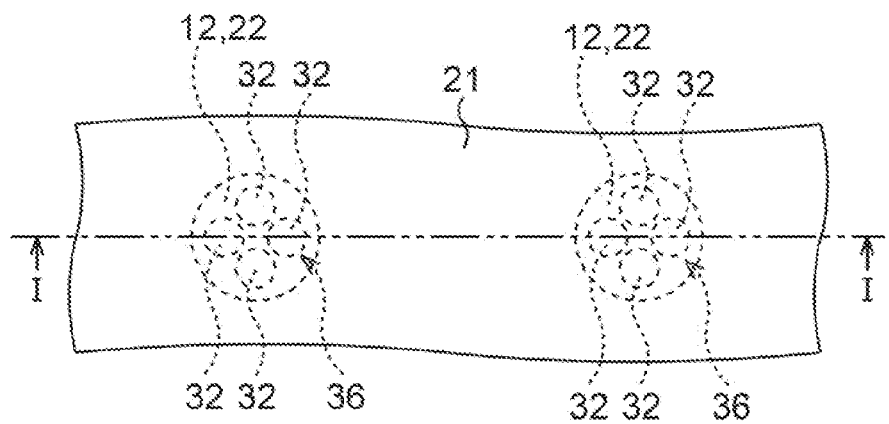
FIG. 2A is a plan view illustrating a structure of a stacked structure according to an embodiment.
Figure 2B:
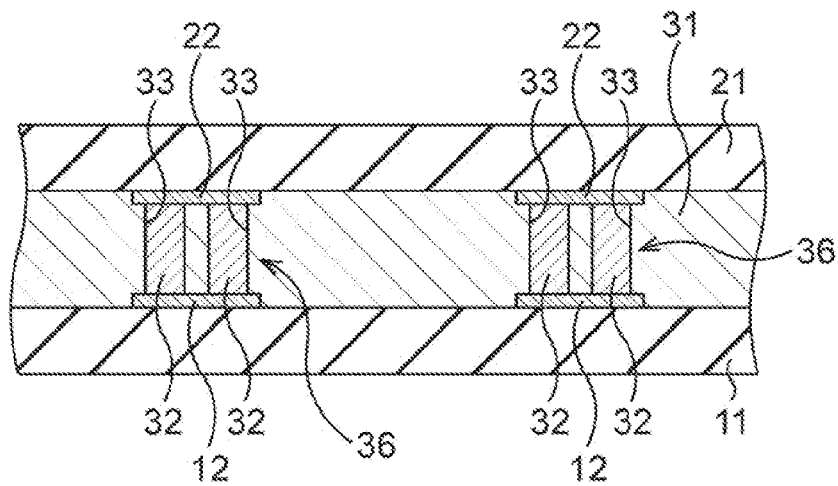
FIG. 2B is a cross-sectional view taken along a line I-I in FIG. 2A.

An embodiment will be described. FIG. 2A and FIG. 2B illustrate the structure of a stacked structure according to an embodiment. FIG. 2A is a plan view and FIG. 2B is a cross-sectional view taken along a line I-I in FIG. 2A.

In the first embodiment, as illustrated in FIG. 2A and FIG. 2B, an adhesive resin material 31 is provided between a substrate 11 which includes electrodes 12 and a substrate 21 which includes electrodes 22. A prepreg is used as the adhesive resin material 31, for example. The electrodes 12 and the electrodes 22 face each other across the adhesive resin material 31. A plurality of conductive vias 32 which electrically connects the electrode 12 and the electrode 22 are provided in the adhesive resin material 31 for each pair of an electrode 12 and an electrode 22 facing each other. The plurality of conductive vias 32 is included in one via group 36. Each conductive via 32 is embedded in a via hole 33 in the adhesive resin material 31.

For example, the pitch of the electrodes 12 and the pitch of the electrodes 22 are 1.0 mm, and the planar shape of the electrodes 12 and the electrodes 22 is a circle having a diameter of 0.5 mm. For example, the number of conductive vias 32 for each pair of an electrode 12 and an electrode 22 is four, and the planar shape of the conductive vias 32 is a circle having a diameter of 0.16 mm. In this case, the total cross-sectional area of the four conductive vias 32 included in one via group 36 is $0.0256 \times \pi$ mm$^2$. This is larger than a cross-sectional area ($0.0225 \times \pi$ mm$^2$) of one conductive via having a diameter of 0.30 mm and can ensure a sufficient electric current path.

Figure 3A:
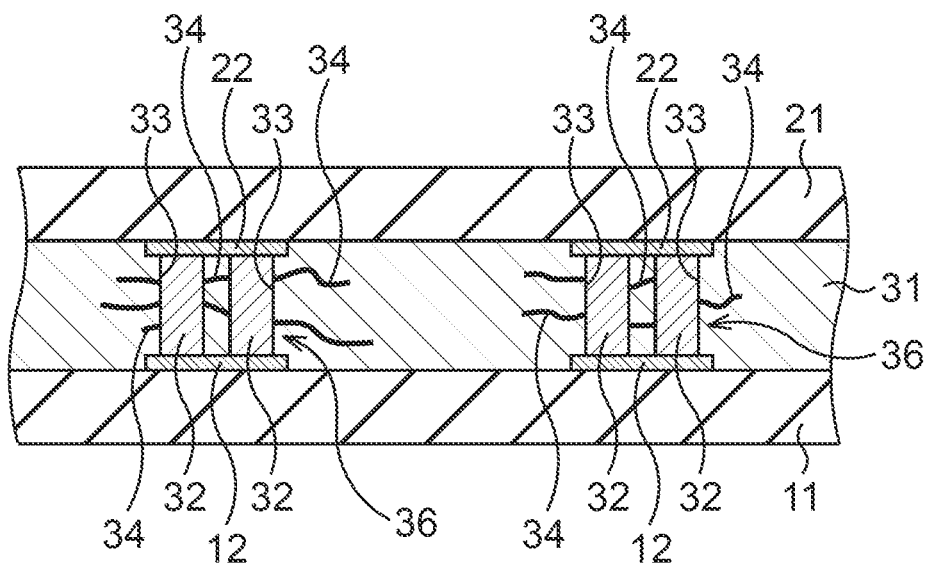
FIGS. 3A and 3B are cross-sectional views illustrating a function of the stacked structure according to the embodiment.

In the stacked structure structured in this manner, since the plurality of conductive vias 32 is provided to each pair of an electrode 12 and an electrode 22, the sufficient electric current path can be ensured even when the diameter of each of the conductive vias 32 is small as compared to the case where only one conductive via is provided as in the reference example. The smaller the diameter of the conductive vias 32, the smaller the vibration operating to the adhesive resin material 31 when the plurality of via holes 33 for conductive via 32 is formed. Accordingly, as illustrated in FIG. 3A, even if cracks 34 occur when the plurality of via holes 33 are formed, the cracks 34 is quite short, and connection of cracks 34 does not occur between the via groups 36. Therefore, it is possible to prevent short circuit like those occurring in conventional stacked structures. Even if short circuit via the cracks 34 occurs between the conductive vias 32 included in one via groups 36, a problem that leads to decrease in yield does not occur.

Figure 3B:
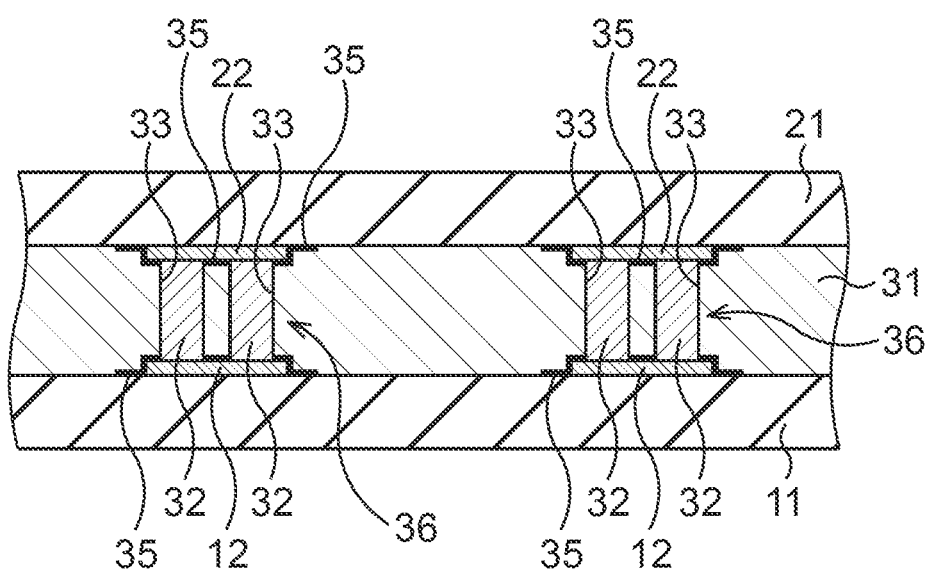

Further, as illustrated in FIG. 3B, there is a chance that a leak 35 of a conductive paste for the conductive via 32 occurs in the vicinity of an upper end and/or a lower end of the conductive via 32. However, the leaks 35 do not spread to the extent that two or more of the electrodes 12 are connected to each other, and also do not spread to the extent that two or more of the electrodes 22 are connected to each other. Even if short circuit occurs via the leak 35 between the conductive vias 32 included in one via group 36, a problem that leads to decrease in yield does not occur.

Next, a method of manufacturing the stacked structure according to the embodiment will be described. FIG. 4A to FIG. 4H are cross-sectional views illustrating the method of manufacturing the stacked structure according to the embodiment in order of steps.

Figure 4A:
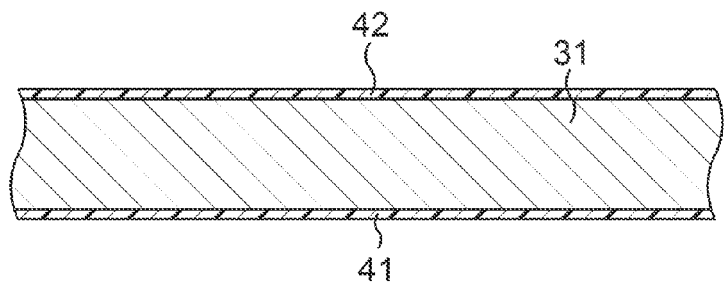
FIG. 4A to FIG. 4H are cross-sectional views illustrating a method of manufacturing the stacked structure according to the embodiment in order of steps.

First, as illustrated in FIG. 4A, a protective film 41 is bonded to a rear surface of the adhesive resin material 31 such as a prepreg, and a protective film 42 is bonded to a front surface of the adhesive resin material 31. A polyethylene terephthalate (PET) film or the like is used as the protective films 41 and 42, for example.

Figure 4B:
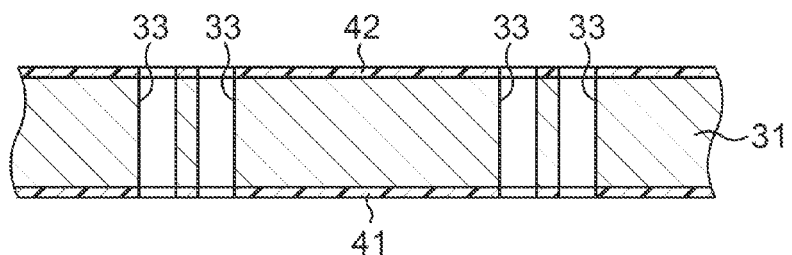

Then, as illustrated in FIG. 4B, a plurality of via holes 33 is formed in the adhesive resin material 31 with the protective films 41 and 42 being bonded thereto. A drill or a laser may be used for forming the via hole 33, for example.

Figure 4C:
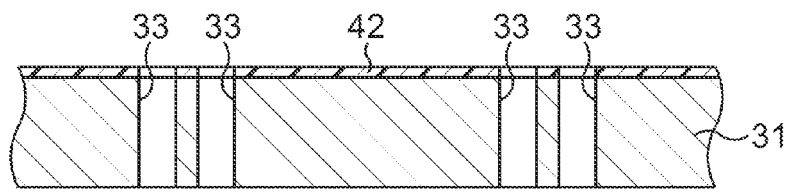

Thereafter, as illustrated in FIG. 4C, the protective film 41 on the rear side is peeled off.

Figure 4D:
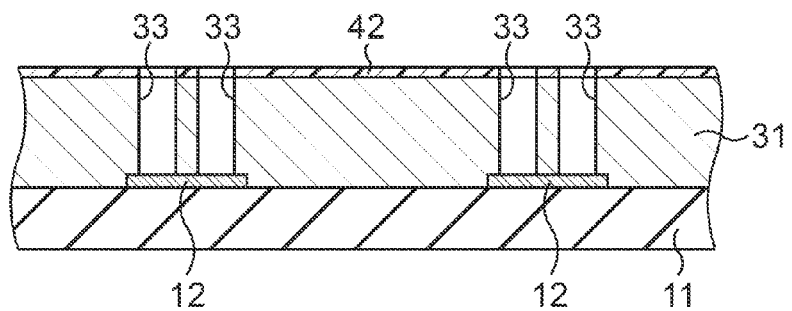

Subsequently, as illustrated in FIG. 4D, the substrate 11 with the electrodes 12 is tentatively bonded to, or attached to, the adhesive resin material 31 so that the electrodes 12 face the adhesive resin material 31. At this time, the electrode 12 is positioned to be exposed through the plurality of the plurality of via holes 33. That is, a plurality of via holes 33 is made to correspond to one electrode 12.

Figure 4E:
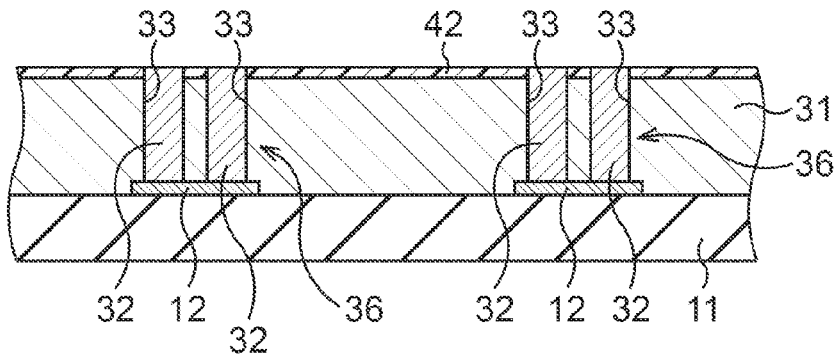

Then, as illustrated in FIG. 4E, a conductive paste is supplied into each of the plurality of via holes 33 so as to form a plurality of conductive vias 32.

Figure 4F:
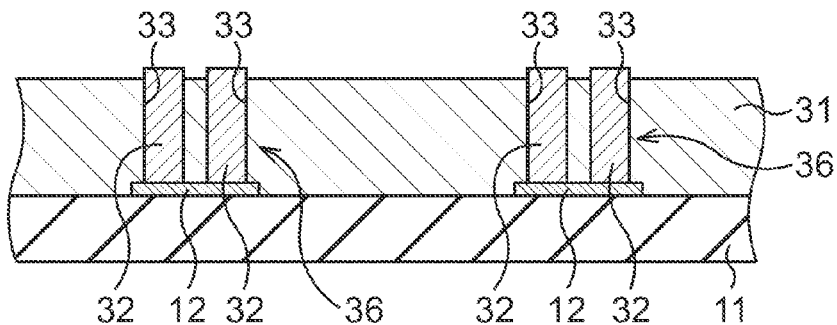

Thereafter, as illustrated in FIG. 4F, the protective film 42 on the front side is peeled off. As a result, upper ends of the conductive vias 32 protrude slightly from the adhesive resin material 31.

Figure 4G:
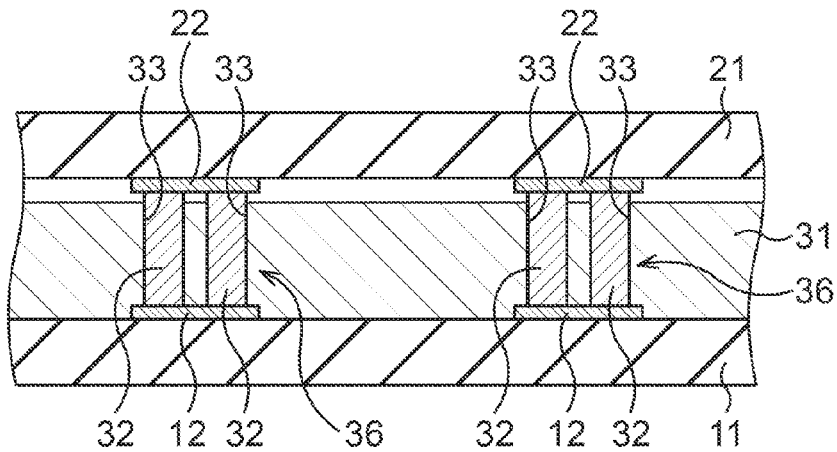

Subsequently, as illustrated in FIG. 4G, the substrate 21 with the electrode 22 are positioned so that one electrode 22 is in contact with protruding portions of a plurality of conductive vias 32.

Figure 4H:
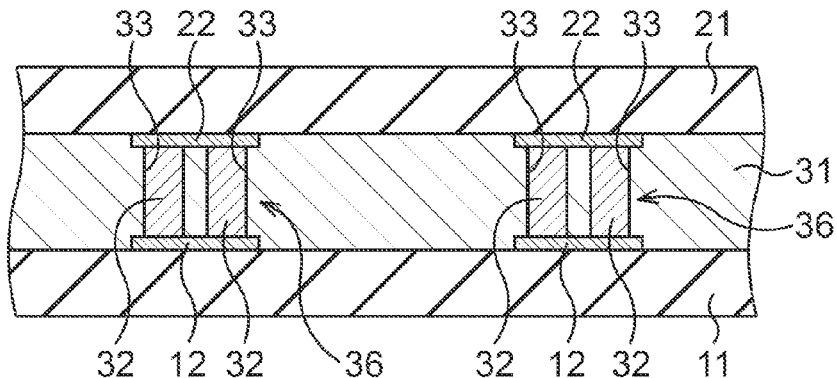

Then, as illustrated in FIG. 4H, the substrate 11 and the substrate 21 are adhered to the adhesive resin material 31 by thermocompression bonding while the electrode 22 is kept in contact with the plurality of conductive vias 32. As a result, the substrate 11, the adhesive resin material 31, and the substrate 21 are integrated.

In this manner, the stacked structure may be obtained. Even if cracks 34 occur when the plurality of via holes 33 is formed (FIG. 4B), the cracks 34 are quite small. Thus, short circuit via the cracks 34 can be prevented.

When a prepreg is used as the adhesive resin material 31, fibers contained in the prepreg are not particularly limited. Glass fibers may be included, or carbon fibers may be included.

The planar shapes of the electrodes 12, the electrodes 22, and the conductive vias 32 need not be a circle. Also the contours, or outlines, of the electrodes 12 and the electrodes 22 need not match each other in planar view. That is, the whole or a part of the contour of one of an electrode 12 and an electrode 22 may be located outside the contour of the other. The number of conductive vias 32 corresponding to a pair of an electrode 12 and an electrode 22 is not particularly limited as long as it is two or more. That is, the number of conductive vias 32 included in one via group 36 is not particularly limited as long as it is two or more.

The above-described embodiment may be applied to a build up substrate.

According to the above-described stacked structure or the like, a plurality of conductive vias is provided between a pair of a first electrode and a second electrode, and thus short circuit can be suppressed while ensuring conductivity between the first electrode and the second electrode.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing a stacked structure, the method comprising:
    forming a plurality of via holes in an adhesive resin material;
    attaching a first substrate including a first electrode to the adhesive resin material so that the first electrode is exposed through the plurality of via holes;
    supplying a conductive paste into each of the plurality of via holes so as to form a plurality of conductive vias; and
    adhering the first substrate and a second substrate to the adhesive resin material by thermocompression bonding while a second electrode on the second substrate is kept in contact with the plurality of conductive vias.

2. The method according to claim 1, wherein the adhesive resin material is a prepreg.

3. The method according to claim 1, wherein the first substrate and the second substrate is a printed wiring board.

4. The method according to claim 1, wherein the plurality of conductive vias is located inside a contour of the first electrode and a contour of the second electrode in planar view.

* * * * *